(12) United States Patent
Takeda et al.

(10) Patent No.: US 12,187,608 B2
(45) Date of Patent: Jan. 7, 2025

(54) BORON NITRIDE POWDER, METHOD FOR PRODUCING SAME, AND HEAT-DISSIPATING MEMBER PRODUCED USING SAME

(71) Applicant: DENKA COMPANY LIMITED, Tokyo (JP)

(72) Inventors: Go Takeda, Omuta (JP); Michiharu Nakashima, Machida (JP); Yoshitaka Taniguchi, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 1305 days.

(21) Appl. No.: 16/755,715

(22) PCT Filed: Aug. 17, 2018

(86) PCT No.: PCT/JP2018/030574
§ 371 (c)(1),
(2) Date: Apr. 13, 2020

(87) PCT Pub. No.: WO2019/073690
PCT Pub. Date: Apr. 18, 2019

(65) Prior Publication Data
US 2020/0247672 A1 Aug. 6, 2020

(30) Foreign Application Priority Data
Oct. 13, 2017 (JP) .................................. 2017-199845

(51) Int. Cl.
*C01B 21/064* (2006.01)
(52) U.S. Cl.
CPC ...... *C01B 21/0645* (2013.01); *C01B 21/0646* (2013.01); *C01P 2002/85* (2013.01); *C01P 2004/30* (2013.01); *C01P 2004/61* (2013.01)

(58) Field of Classification Search
None
See application file for complete search history.

(56) References Cited

U.S. PATENT DOCUMENTS

| 5,854,155 A | 12/1998 | Kawasaki et al. |
| 6,348,179 B1 | 2/2002 | Paine et al. |
| (Continued) | | |

FOREIGN PATENT DOCUMENTS

| CN | 105026312 A | 11/2015 |
| JP | H09-202663 A | 8/1997 |
| (Continued) | | |

OTHER PUBLICATIONS

Nov. 6, 2018 Search Report issued in International Application No. PCT/JP2018/030574.

*Primary Examiner* — Guinever S Gregorio
(74) *Attorney, Agent, or Firm* — Oliff PLC

(57) ABSTRACT

To provide a boron nitride powder having excellent heat conductivity and high particle strength. Provided is a boron nitride powder which comprises bulky boron nitride formed such that scaly primary particles of hexagonal boron nitride are aggregated to form bulky particles, and which has the following characteristics (A) to (C):

(A) a particle strength of the bulky particles at a cumulative breakdown rate of 63.2% is 5.0 MPa or more;
(B) an average particle size of the boron nitride powder is 2 μm or more and 20 μm or less; and
(C) an orientation index of the boron nitride powder as determined from X-ray diffraction is 20 or less.

4 Claims, 2 Drawing Sheets

(56) References Cited

U.S. PATENT DOCUMENTS

| | | |
|---|---|---|
| 2002/0155052 A1 | 10/2002 | Paine et al. |
| 2005/0041373 A1 | 2/2005 | Pruss et al. |
| 2012/0114905 A1 | 5/2012 | Engler et al. |
| 2012/0196128 A1 | 8/2012 | Gohara et al. |
| 2014/0349105 A1 | 11/2014 | Yamazaki et al. |
| 2016/0060112 A1 | 3/2016 | Nishi et al. |
| 2016/0340191 A1 | 11/2016 | Ikemiya et al. |
| 2016/0368769 A1 | 12/2016 | Kurokawa et al. |
| 2020/0040245 A1* | 2/2020 | Takeda .................... C09C 3/08 |

FOREIGN PATENT DOCUMENTS

| | | |
|---|---|---|
| JP | 2000-154265 A | 6/2000 |
| JP | 2000-327312 A | 11/2000 |
| JP | 2007-502770 A | 2/2007 |
| JP | 2007-308360 A | 11/2007 |
| JP | 2011-098882 A | 5/2011 |
| JP | 2013-241321 A | 12/2013 |
| JP | 2013-543834 A | 12/2013 |
| JP | 2014-040341 A | 3/2014 |
| JP | 2016-135730 A | 7/2016 |
| JP | 2017-57098 A | 3/2017 |
| WO | 2015/122379 A1 | 8/2015 |
| WO | 2016/092952 A1 | 6/2016 |
| WO | 2018/066277 A1 | 4/2018 |

* cited by examiner

[Figure 1]
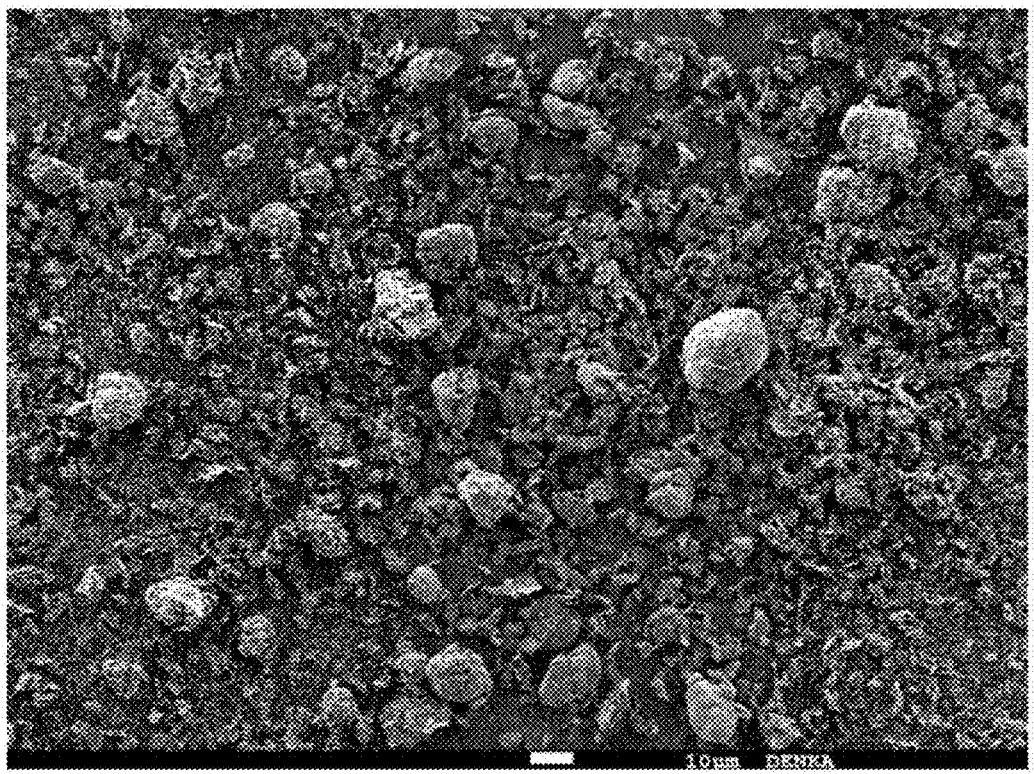
[Figure 2]
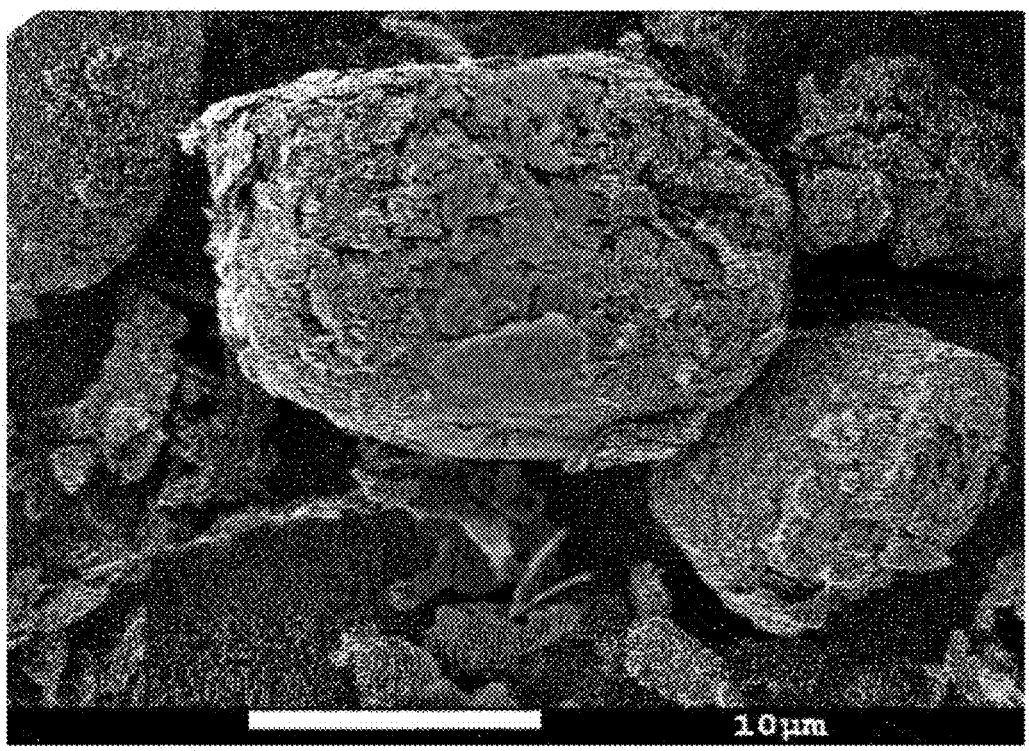

[Figure 3]
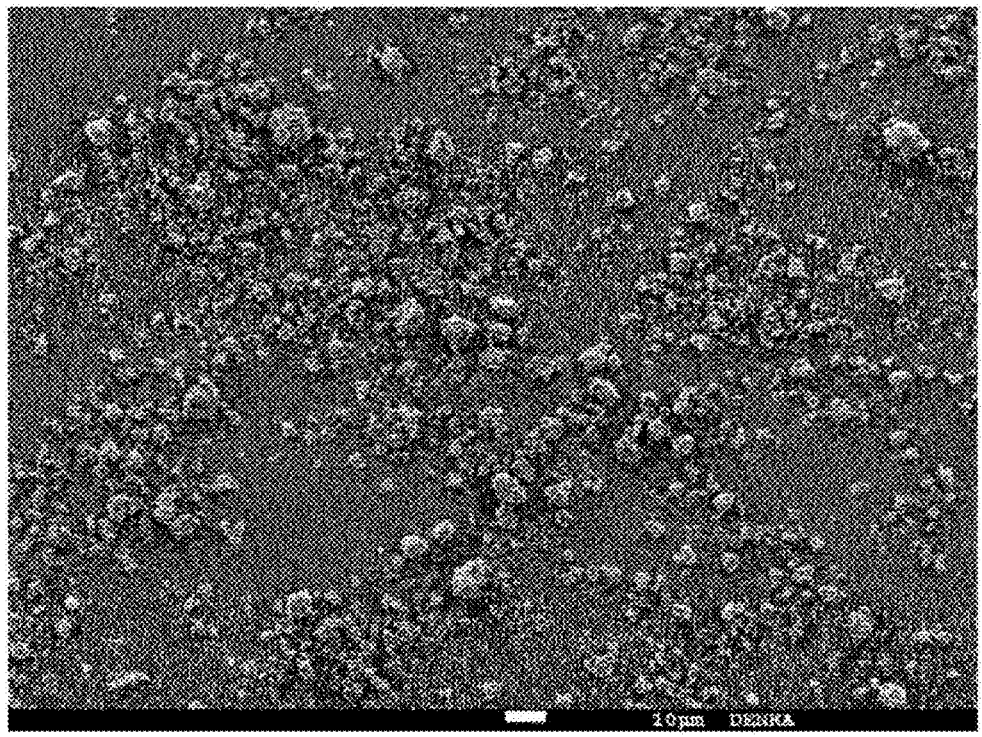
[Figure 4]
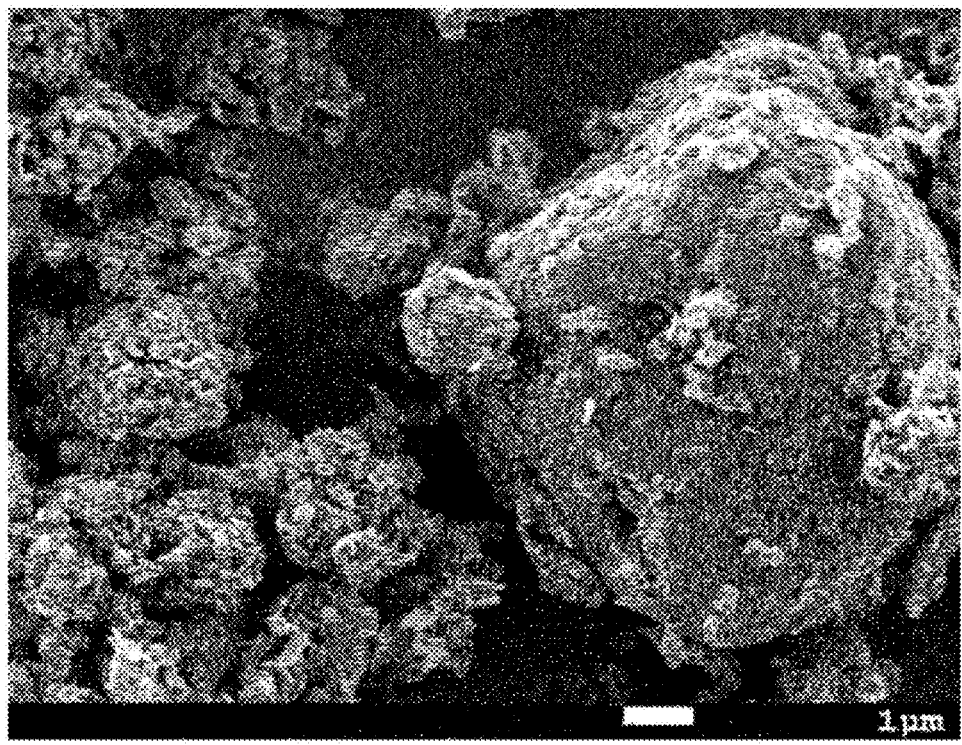

BORON NITRIDE POWDER, METHOD FOR PRODUCING SAME, AND HEAT-DISSIPATING MEMBER PRODUCED USING SAME

TECHNICAL FIELD

The present invention relates to boron nitride (BN) powder, a method for production thereof and an application thereof. In particular, the present invention relates to a boron nitride powder, a method for production thereof and heat conductive resin composition produced using thereof.

BACKGROUND ART

In heat generating electronic parts such as a power device, transistor, thyristor, CPU, the important problem is how to effectively dissipate heat generated during use. Conventionally, measures for dissipating of heat have been generally taken: (1) enhancing heat conductivity of an insulating layer of a printed wiring board on which a heat generating electronic part is mounted, and (2) attaching a heat generating electronic part or a printed wiring board on which a heat generating electronic part is mounted to a heat sink via an electrically insulating thermal interface material. As an insulating layer of a printed wiring board and a thermal interface material, a silicone resin or an epoxy resin filled with ceramic powder has been used.

In recent years, heat generation density inside an electronic device has been increasing every year with increase in the speed and integration of a circuit inside a heat generating electronic part, and with increase in packing density of heat generating electronic parts on a printed wiring board. Therefore, a ceramic powder having higher heat conductivity than the conventional one has been required.

Furthermore, the thickness of an insulating layer to be used tends to be reduced compared to the conventional thickness of several hundreds m in association with enhancement of performance of the above electronic members, and may be several tens μm or more and 100 μm or less, and thus the particle size of the corresponding fillers are also required to be as small as 20 μm or less compared to a conventional average particle size of several tens to several hundreds μm.

Based on these backgrounds, a hexagonal boron nitride powder, which has excellent properties as an electrically insulating material such as high heat conductivity, high insulation properties and low specific dielectric constant, is attracting attentions.

However, while the heat conductivity in in-plane direction (a-axis direction) of hexagonal boron nitride particles is 400 W/(m·K), the heat conductivity in the thickness direction (c-axis direction) is 2 W/(m·K), which result in large anisotropy of heat conductivity due to their crystal structure and scaly shape. Furthermore, when a resin is filled with a hexagonal boron nitride powder, the particles of the powder are oriented in one direction.

Therefore, for example in production of a thermal interface material, the in-plane direction (a-axis direction) of the hexagonal boron nitride particle and the thickness direction of the thermal interface material are perpendicular to each other, and thus high heat conductivity in the in-plane direction (a-axis direction) of the hexagonal boron nitride particle may not have been sufficiently utilized.

Patent literature 1 suggests a highly heat conductive sheet in which the in-plane direction (a-axis direction) of hexagonal boron nitride particles is oriented in the thickness direction of a highly heat conductive sheet, and thus high heat conductivity in the in-plane direction (a-axis direction) of the hexagonal boron nitride particles may be utilized.

However, the conventional technique described in patent literature 1 has the following problems: (1) the oriented sheets need to be laminated in the next step and the production steps tend to be complicated, and that (2) the laminated and cured product needs to be cut in the form of thin sheets and it is difficult to ensure dimension precision of the thickness of the sheets. Furthermore, since hexagonal boron nitride particles have a scaly shape, the viscosity of a resin increases when the resin is filled with the particles, which results in poor fluidity, and thus high filling is difficult.

In order to improve these problems, boron nitride powders of various shapes having reduced anisotropy of heat conductivity of the hexagonal boron nitride particle are proposed.

Patent literature 2 suggests use of a boron nitride powder in which primary particles of hexagonal boron nitride particles are aggregated without being oriented in one direction, and it is considered that anisotropy of heat conductivity may be reduced. As other conventional techniques for production of aggregated boron nitride, production of spherical boron nitride by a spray dry method (patent literature 3), production of aggregates of boron nitride by using boron carbide as a raw material (patent literature 4) and production of aggregated boron nitride by repeated pressing and crushing (patent literature 5) are also known. However, actually only a bulky boron nitride powder having a particle size of more than 20 μm can be produced by these techniques, and bulky boron nitride having a particle size of 20 μm or less cannot be obtained.

As an aggregated boron nitride powder having an average particle size of 20 μm or less, for example SGPS (product name, manufactured by Denka Company Limited) is commercially available, and SGPS had insufficient particle strength and a high orientation index, and thus it provided insufficient heat dissipation.

On the other hand, the method of obtaining a spherical boron nitride fine powder using vapor phase synthesis has been reported (patent literature 6), and the particles obtained by this method had a small average particle size and thus provided insufficient heat dissipation.

CITATION LIST

Patent Literature

Patent Literature 1: Japanese Patent Laid-Open No. 2000-154265
Patent Literature 2: Japanese Patent Laid-Open No. 9-202663
Patent Literature 3: Japanese Patent Laid-Open No. 2014-40341
Patent Literature 4: Japanese Patent Laid-Open No. 2011-98882
Patent Literature 5: Japanese Translation of PCT International Application Publication No. 2007-502770
Patent Literature 6: Japanese Patent Laid-Open No. 2000-327312

SUMMARY OF INVENTION

Technical Problem

In the above conventional techniques, it is impossible to solve the following problem: produced aggregated particles have a size more than approximately 20 µm and aggregated particles having a particle size of 20 µm or less cannot be produced. Therefore, production of a bulky boron nitride powder of 20 µm or less having a low degree of orientation and high compressive strength was difficult by the conventional techniques.

Solution to Problem

Accordingly, the object of the present invention is to provide a boron nitride powder having excellent heat conductivity, high particle strength and an average particle size of 2 µm or more and 20 µm or less.

The present inventors engaged in diligent study and consequently completed the present invention by discovering that a boron nitride powder having excellent heat conductivity, high particle strength and an average particle size of 2 µm or more and 20 µm or less may be produced by the specific production method.

Specifically, the embodiments of the present invention may provide the following.

A boron nitride powder which comprises bulky boron nitride formed such that scaly primary particles of hexagonal boron nitride are aggregated to form bulky particles, and which has the following characteristics (A) to (C):

(A) a particle strength of the bulky particles at a cumulative breakdown rate of 63.2% is 5.0 MPa or more;

(B) an average particle size of the boron nitride powder is 2 µm or more and 20 µm or less; and (C) an orientation index of the boron nitride powder as determined from X-ray diffraction is 20 or less.

A heat-dissipating member comprising the boron nitride powder according to [1] and having a film thickness of 100 µm or less.

A method for producing the boron nitride powder according to [1], the method comprising:
  a pressure nitriding baking step of baking boron carbide having a carbon content of 18% or more and 21% or less and an average particle size of 5 µm or more and 15 m or less in a pressurized nitrogen atmosphere at 1800° C. or more and 0.6 MPa or more;
  a decarbonizing crystallization step of mixing a baked product obtained by the pressure nitriding baking step with a boron source, and heating the resulting mixture to a temperature capable of initiating decarbonization, then heating the mixture to a retention temperature of 1800° C. or more at a temperature rising rate of 5° C./min or less, and retaining the mixture in a nitrogen atmosphere at the retention temperature to obtain bulky boron nitride;
  a pulverizing step of pulverizing the bulky boron nitride obtained by the decarbonizing crystallization step to obtain the boron nitride powder having an average particle size of 2 µm or more and 20 µm or less.

A method for producing the boron nitride powder according to [1], the method comprising:
  a vapor phase reaction step of subjecting alkoxide borate gas and ammonia gas to vapor phase reaction at 750° C. or more;
  a crystallization step of heating an intermediate obtained by the vapor phase reaction step until a baking temperature of 1500° C. or more is reached under conditions of an atmosphere containing 20 vol % or less of ammonia up to 1000° C. and an atmosphere containing 50 vol % or more of ammonia at 1000° C. or more, and baking the intermediate at the baking temperature to obtain bulky boron nitride;
  a pulverizing step of pulverizing the bulky boron nitride obtained by the crystallization step to obtain the boron nitride powder having an average particle size of 2 µm or more and 20 µm or less.

Advantageous Effect of Invention

The boron nitride powder obtained by the embodiment of the present invention has an average particle size of 2 µm or more and 20 µm or less, and in addition, provides effects of excellent heat conductivity and high particle strength.

BRIEF DESCRIPTION OF DRAWINGS

FIG. 1 shows a photograph by electron microscopy for the boron nitride powder obtained by the production method according to Example 1 of the present invention.

FIG. 2 shows a high-resolution photograph (enlarged view) by electron microscopy for the boron nitride powder obtained by the production method according to Example 1 of the present invention.

FIG. 3 shows a photograph by electron microscopy for the boron nitride powder obtained by the production method according to Example 2 of the present invention.

FIG. 4 shows a high-resolution photograph (enlarged view) by electron microscopy for the boron nitride powder obtained by the production method according to Example 2 of the present invention.

DESCRIPTION OF EMBODIMENTS

The numerical range as used herein includes the upper limit value and the lower limit value unless otherwise specified. As used herein, "part" or "%" is based on mass unless otherwise specified. The unit of pressure as used herein is gauge pressure unless otherwise noted, and it should be noted that a notation of (G) or (gage) is omitted.

<1. Boron Nitride Powder>

The boron nitride powder according to the embodiment of the present invention comprises bulky boron nitride which is formed such that scaly primary particles of hexagonal boron nitride are aggregated to be a bulky mass, and which has the following characteristics.

<Bulky Boron Nitride Particle>

Herein, the term "bulky boron nitride particle" or "bulky particles" which is not based on the conventional technique means boron nitride particles formed such that scaly primary particles of hexagonal boron nitride are aggregated to be a bulky mass. The bulky boron nitride particles of the present invention have a particle strength (compressive strength of a single granule) obtained according to JIS R 1639-5:2007 of 5.0 MPa or more at a cumulative breakdown rate of 63.2%. When the particle strength is less than 5.0 MPa, aggregated particles are collapsed by stress during kneading with a resin, pressing, or the like, resulting in the problem of reduction of heat conductivity. The value "63.2%" is known to be the value satisfying ln ln {1/(1−F(t))}=0 in Weibull distribution function shown in JIS R 1625:2010 cited in the above JIS R 1639-5:2007, and is a criterion value of the number of particles.

In a preferable embodiment, the particle strength of bulky particles at a cumulative breakdown rate of 63.2% may be 6.0 MPa or more, more preferably 7.0 MPa or more.

The upper limit value of the particle strength of the bulky particles at a cumulative breakdown rate of 63.2% is not particularly limited, and for example bulky particles may be produced so as to achieve the particle strength of 30 MPa or less, 20 MPa or less, or the like.

<Boron Nitride Powder>

The "boron nitride powder" according to the embodiment of the present invention may have an average particle size of 2 μm or more, more preferably 4 μm or more, further preferably 5 μm or more. The average particle size of the boron nitride powder may be 20 μm or less, more preferably 19 μm or less, further preferably 18 μm or less. The range of the average particle size of the boron nitride powder may be 2 μm or more and 20 μm or less, more preferably 4 μm or more and 18 μm or less.

When this average particle size is as too small as less than 2 μm, a problem of reduction of heat conductivity is caused. On the other hand, when this average particle size is as too large as more than 20 μm, the difference between the thickness of a sheet and the average particle size of the boron nitride powder is smaller in the case of producing a sheet having thickness of several tens μm, and thus production of a sheet may be difficult.

<Orientation Index of Boron Nitride Powder>

The orientation index of the boron nitride powder according to the embodiment of the present invention may be obtained by X-ray diffraction, and the value may be 20 or less, preferably 19 or less, more preferably 18 or less.

When this orientation index is as too large as more than 20, a problem of reduction of heat conductivity is caused. The lower limit of the orientation index is not particularly limited, and even in the case of completely random orientation, the orientation index would be generally considered to be about 6.

In a preferable embodiment, the boron nitride powder may have heat conductivity of 6 W/(m·K) or more. Since the boron nitride powder has such high heat conductivity in combination with high particle strength of aggregated particles, it may be suitably used as a heat-dissipating member of a heat generating electronic part of a power device, or the like, in particular suitably used as a raw material for thin film application.

<2. Production Method of Boron Nitride Powder>

The boron nitride powder according to the embodiment of the present invention may be produced by any of the following two procedures.

<Procedure (a)>

Procedure (a) comprises a pressure nitriding baking step, decarbonizing crystallization step, and pulverizing step.

<Pressure Nitriding Baking Step>

In the pressure nitriding baking step of procedure (a), boron carbide having a carbon content of 18% or more and 21% or less and an average particle size of 5 μm or more and 15 μm or less is used as a raw material. This boron carbide raw material is subjected to pressure nitriding baking at a specific baking temperature described below and in an atmosphere of pressurized condition, and thus boron carbonitride may be obtained.

<Boron Carbide Raw Material Used for Pressure Nitriding Baking Step>

Since the average particle size of a boron carbide raw material have an influence on the average particle size of the finally obtained bulky boron nitride, the average particle size is 5 μm or more and 15 μm or less. Boric acid and free carbon as impurities are desirably not contained in a boron carbide raw material except for unavoidable one, or contained in a small amount even in the case of being contained.

The lower limit value of the average particle size of a boron carbide raw material may be preferably 6 μm or more, more preferably 8 μm or more. When the average particle size is less than 5 μm, a problem of larger orientation index of the produced bulky particles is caused.

The upper limit value of the average particle size of boron carbide may be preferably 14 μm or less, more preferably 13 μm or less. The case in which the average particle size of a boron carbide is larger than 15 μm is not preferable because the produced bulky particles are too large and coarse particles tend to remain even if pulverization is conducted. The case in which pulverization is conducted until such coarse particles are completely removed is also not preferable, because a problem of larger orientation index is caused in turn.

The carbon content of a boron carbide raw material used for the pressure nitriding baking step is desirably lower than 21.7% which corresponds to composition of $B_4C$, and may be preferably within the range of 18.0% or more and 20.5% or less. The lower limit value of the carbon content of the boron carbide may be preferably 19% or more. The upper limit value of the carbon content of the boron carbide may be preferably 20.5% or less. The case in which the carbon content is as too high as more than 21% is not preferable, because problems are caused wherein the carbon content vaporized during the decarbonizing crystallization step described below is too much, dense bulky boron nitride may not be produced, and the carbon content of finally produced boron nitride is too high. It is difficult to produce stable boron carbide having a carbon content of less than 18% since the difference between the actual content and theoretical composition is too large.

Known production methods may be applied to the production method of the boron carbide, and the boron carbide having the desired average particle size and carbon content may be obtained.

For example, boric acid and acetylene black are mixed, then the resulting mixture is heated in an inert gas atmosphere at 1800 to 2400° C. for 1 to 10 hours, and thus a bulky mass of boron carbide may be obtained. This bulky mass of boron carbide is pulverized, then appropriately subjected to sieving, washing, impurity removal, drying, and the like, and thus boron carbide powder may be produced.

Mixing of boric acid and acetylene black as row materials of boron carbide is preferably conducted when 25 to 40 parts by mass of acetylene black is used per 100 parts by mass of boric acid.

The atmosphere for producing boron carbide is preferably an inert gas. Examples of inert gas include, for example, argon gas and nitrogen gas, and these may be appropriately used singly or in combination. Among these, argon gas is preferable.

For pulverization of a bulky mass of boron carbide, a common pulverizer or cracking machine may be used, and for example by pulverization for about 0.5 to 3 hours, suitable particle size may be obtained. The boron carbide after pulverization is suitably sieved using a sieve mesh to be classified into a particle size of 75 μm or less.

<Various Conditions in Pressure Nitriding Baking Step>

The baking temperature in the pressure nitriding baking step may be 1800° C. or more, preferably 1900° C. or more. The upper limit value of the baking temperature may be preferably 2400° C. or less, more preferably 2200° C. or less. The range of the baking temperature of a preferable embodiment may be 1800 to 2200° C.

The pressure in the pressure nitriding baking step may be 0.6 MPa or more, more preferably 0.7 MPa or more. The upper limit of the pressure may be preferably 1.0 MPa or less, further preferably 0.9 MPa or less. The range of the pressure in a preferable embodiment may by 0.7 to 1.0 MPa.

When the pressure is less than 0.6 MPa, a problem is caused in which nitriding of boron carbide does not sufficiently proceed. In terms of cost, the pressure is desirably 1.0 MPa or less, and the pressure of 1.0 MPa or more is also possible.

The baking temperature and pressure condition in pressure nitriding baking step of a preferable embodiment may be 1800 to 2200° C. and 0.7 to 1.0 MPa. The pressure is less than 0.7 MPa at a baking temperature of 1800° C., nitriding of boron carbide may not sufficiently proceed.

As an atmosphere in the pressure nitriding baking step, a gas which enables nitriding reaction to proceed is required. Examples thereof include nitrogen gas and ammonia gas, and these may be used singly or in combinations of two or more. Among these, nitrogen gas is preferable in terms of facility of nitriding and cost. The atmosphere preferably may contain at least 95% (V/V) or more of nitrogen gas, further preferably 99.9% (V/V) or more.

The baking time in the pressure nitriding baking step is not particularly limited as long as the baking time enables nitriding to sufficiently proceed, and it may be preferably 6 to 30 hours, more preferably 8 to 20 hours.

<Decarbonizing Crystallization Step>

In the decarbonizing crystallization step in procedure (a), the boron carbonitride obtained in the pressure nitriding baking step is heated to a retention temperature at a specific temperature rising rate described below in an atmosphere of normal pressure or higher, heat-treated by being retained within a specific temperature range for a certain time to obtain bulky boron nitride particles formed such that scaly primary particles of hexagonal boron nitride are aggregated to be a bulky mass. Specifically, in this decarbonizing crystallization step, boron carbonitride is decarbonized as well as formed into a scaly shape having a specified size, which is at the same time aggregated to form bulky boron nitride particles.

The temperature capable of initiating decarbonization in the decarbonizing crystallization step is the temperature which may be set depending on the system, and may be set for example within the range of 1000 to 1500° C., more preferably 1000 to 1200° C. The atmosphere of normal pressure or higher means that normal pressure (atmospheric pressure) or pressurized atmosphere may be used, and in the case of pressurizing, the pressure may be for example 0.5 MPa or less, preferably 0.3 MPa or less.

After heating to a temperature capable of initiating decarbonization, rate of temperature rising to the retention temperature may be 5° C./min (i.e., degree centigrade per minute) or less, preferably 4° C./min or less, 3° C./min or less, or 2° C./min or less.

The retention temperature after the above-described temperature rising may be 1800° C. or more, further preferably 2000° C. or more. The upper limit value of the retention temperature is not particularly limited, and may be preferably 2200° C. or less, more preferably 2100° C. or less. When the retention temperature is as too low as less than 1800° C., particle growth does not sufficiently occur, which may result in reduction of heat conductivity. On the other hand, when the retention temperature is 1800° C. or more, particle growth tends to successfully occurs, and thus effect of enhancement of heat conductivity is obtained.

The retention time at the retention temperature is not particularly limited as long as it enables crystallization to sufficiently proceed, and in a preferable embodiment, the retention time may be for example within the range of more than 0.5 hours and less than 40 hours, more preferably within the range of 1 to 30 hours. The retention time may be preferably 1 hour or more, more preferably 3 hours or more, further preferably 5 hours or more, and even more preferably 10 hours or more. The upper limit value of the retention time may be preferably 30 hours or less, more preferably 20 hours or less. When the retention time is 1 hour or more, particle growth is expected to successfully occur. When the retention time is 30 hours or less, excessive proceeding of particle growth and reduction of particle strength caused thereby may be reduced, and furthermore, industrial disadvantage due to long baking time may be also expected to be reduced.

In the decarbonizing crystallization step, a boron source as a raw material is mixed in addition to boron carbonitride obtained in the pressure nitriding baking step to conduct decarbonizing crystallization. Examples of the boron source include boric acid, boron oxide or a mixture thereof (and in addition, other additives used in the art, if necessary).

The mixing ratio of the boron carbonitride and the boron source may be suitably determined depending on molar ratio. When boric acid or boron oxide is used as a boron source, for example, 100 to 300 parts by mass of boric acid or boron oxide, more preferably 150 to 250 parts by mass of boric acid or boron oxide may be used per 100 parts by mass of boron carbonitride.

<Pulverizing Step>

By conducting the pressure nitriding baking step and the decarbonizing crystallization step, bulky particles formed by aggregation of scaly boron nitride particles (primary particles) may be obtained. Since these bulky particles obtained by the embodiment has high particle strength, the effect of being able to maintain the bulky form and low orientation index is provided even when the bulky particles is pulverized so as to obtain an average particle size after pulverization of 2 μm or more and 20 m or less.

In the pulverizing step, a common pulverizer or cracking machine may be used, and examples thereof include a ball mill, a vibration mill and a jet mill. As used herein, "pulverizing" encompasses "cracking".

<Procedure (b)>

Procedure (b) comprises a vapor phase reaction step, a crystallization step, and a pulverizing step.

<Vapor Phase Reaction Step>

In the vapor phase reaction step, vapor phase synthesis is conducted at a reaction temperature of 750° C. or more using alkoxide borate gas and ammonia gas as raw materials to obtain an intermediate. In the vapor phase reaction step, a tube furnace may be used (furnace temperature, i.e., vapor phase reaction temperature may be in the range of 750 to 1,600° C.). An inert gas flow is used as a carrier gas and alkoxide borate is vaporized in the inert gas flow and thus may be undergo vapor phase reaction with ammonia gas.

Examples of the inert gas flow may include nitrogen gas and rare gas such as neon and argon.

The reaction time of alkoxide borate gas and ammonia gas is preferably within 30 seconds in order that the average particle size of the obtained boron nitride powder falls within the specified range.

The alkoxide borate is not particularly limited. In a preferable embodiment, alkoxide borate is preferably those in which each "alkyl group (R)" of "alkoxide (RO—)" is independently a linear or branched alkyl chain having 1 to 5 carbon atoms. Specific examples of alkoxide borate include, for example, trimethyl borate, triethyl borate and triisopropyl borate. Among these, trimethyl borate is preferable in terms of reactivity with ammonia and availability.

The molar ratio of alkoxide borate:ammonia which are used in the vapor phase reaction step may be preferably within the range of 1:(1 to 10), more preferably 1:(1 to 2) in order that the average particle size of the boron nitride powder falls within a specified range.

<Crystallization Step>

In the crystallization step, the intermediate obtained in the vapor phase reaction step is formed into scaly boron nitride. Under the temperature condition of the crystallization step, temperature is raised in an ammonia atmosphere containing 20 vol % or less of ammonia gas, more preferably 15 vol % or less from the start of temperature rising until 1000° C. is reached. As other gas, an inert gas is contained in the ammonia atmosphere, preferably nitrogen or argon may be contained.

Further temperature rising after 1000° C. is reached is conducted until the baking temperature is reached in an ammonia atmosphere containing 50 vol % or more of ammonia gas, in terms of reduction of oxygen content and maximization of yield. The baking temperature may be 1500° C. or more, more preferably 1600° C. or more, further preferably 1700° C. or more. As other gas, an inert gas is contained in the ammonia atmosphere, and nitrogen gas is suitable. The retention time at the baking temperature is preferably 1 to 20 hours.

<Pulverizing Step>

Since the scaly boron nitride powder obtained by conducting the above vapor phase synthesis step and crystallization step has a high particle strength, it is still possible to maintain the bulky form and low orientation index even when the secondary particles (aggregated particles) are pulverized so as to have the above-described average particle size. Therefore, the pulverizing step may be conducted similarly to procedure (a).

<3. Heat Conductive Resin Composition>

According to an embodiment of the present invention, a heat conductive resin composition may be produced by using the above-described boron nitride powder so as to incorporate it in the composition. As a method for producing this heat conductive resin composition, a known production method may be used. The obtained heat conductive resin composition may be widely used for a heat-dissipating member and the like.

<Resin>

As a resin used for the heat conductive resin composition, for example, epoxy resin, silicone resin, silicone rubber, acrylic resin, phenol resin, melamine resin, urea resin, unsaturated polyester, fluorine resin, polyamide (such as polyimide, polyamideimide, polyetherimide), polyester (such as polybutylene terephthalate, polyethylene terephthalate), polyphenylene ether, polyphenylene sulfide, wholly aromatic polyester, polysulfone, liquid crystal polymer, polyether sulfone, polycarbonate, maleimide-modified resin, ABS resin, AAS (acrylonitrile-acrylic rubber-styrene) resin, AES (acrylonitrile-ethylene-propylene-diene rubber-styrene) resin may be used. In particular, an epoxy resin (suitably naphthalene-type epoxy resin) has excellent heat resistance and adhesion strength to a copper foil circuit, and thus it is suitable for an insulating layer of a printed wiring board. A silicone resin has excellent heat resistance, flexibility and adhesion to a heat sink and the like, and thus it is suitable as a thermal interface material.

Examples of curing agents in the case of using an epoxy resin include, specifically, phenol novolak resin, acid anhydride resin, amino resin and imidazols. Among these, imidazols are preferable. The amount of the curing agent blended is preferably 0.5 parts by mass or more and 15 parts by mass or less, further preferably 1.0 parts by mass or more and 10 parts by mass or less.

The amount of the boron nitride powder used per 100 vol % of the heat conductive resin composition is preferably 30 vol % or more and 85 vol % or less, more preferably 40 vol % or more and 80 vol % or less.

When the amount of the boron nitride powder used is 30 vol % or more, heat conductivity enhances and sufficient heat dissipating properties may be easily obtained. When the content of the boron nitride powder is 85 vol % or less, tendency of formation of voids during shaping may be reduced, and thus reduction of insulation properties and mechanical strength may be reduced.

Various measurement methods are as follows.

(1) Average Particle Size

An average particle size was measured using a laser diffraction-scattering type particle size distribution measurement apparatus ("LS-13 320" manufactured by Beckman Coulter, Inc.) without treating a sample by a homogenizer before measurement. The obtained average particle size is the average particle size based on statistic values by volume.

(2) Particle Strength

Measurements were conducted according to JIS R1639-5:2007. As a measurement apparatus, a microcompression testing machine ("MCT-W500" manufactured by SHIMADZU CORPORATION) was used. Particle strength ($\sigma$: unit MPa) was calculated at a cumulative breakdown rate of 63.2% by conducting measurements for 20 or more particles using the equation $\sigma = \alpha \times P/(\pi \times d^2)$ wherein a is a dimensionless number variable according to the position within the particle ($\alpha = 2.48$), P is compression test force (unit N) and d is particle size (unit μm). When the average particle size is less than 2 μm, particle strength could not be calculated.

(3) Measurement of Degree of Orientation

An X-ray diffraction apparatus ("ULTIMA-IV" manufactured by Rigaku Corporation) was used for measurements of the degree of orientation. The boron nitride powder was solidified to produce a sample, which was then irradiated with X-ray, and the ratio of peak strength of (002) plane and (100) plane, i.e., (002)/(100), was calculated and evaluated.

(4) Evaluation Method of Heat Conductivity

The heat conductivity was measured using a sheet as a measurement sample produced from a heat conductive resin composition containing a boron nitride powder. The heat conductivity (H: unit W/(m·K)) was calculated from heat diffusivity (A: unit m²/sec), density (B: unit kg/m³) and specific heat capacity (C: unit J/(kg·K)) using H=A×B×C. The sheet as a measurement sample was processed into width 10 mm×10 mm×thickness 0.05 mm and the heat diffusivity was obtained by laser flash method. A xenon flash analyzer ("LFA447NanoFlash" manufactured by NETZSCH Japan K.K.) was used as a measurement apparatus. The density was obtained using the Archimedes method. The specific heat capacity was obtained using DSC ("ThermoPlus Evo DSC8230" manufactured by Rigaku Corporation). The acceptable value of the heat conductivity was set at 5 W/(m·K) or more.

(5) Evaluation of Film Formation

For the sheets having thickness of 0.05 mm (film thickness 50 μm) and produced for the evaluation of heat conductivity in above (4), the sheet wherein successful film formation without any unevenness was visually confirmed was determined as being the sign of circle (i.e., acceptable), and on the other hand, the sheet wherein film formation was unsuccessful due to poor leveling during production and unevenness caused thereby was determined as X-mark (i.e., unacceptable).

(6) Measurement of Carbon Content

The carbon content of boron carbide was measured by a carbon content analyzing apparatus ("IR-412" manufactured by LECO JAPAN CORPORATION).

EXAMPLES

Herein, the present invention will be described in detail with reference to Examples and Comparative Examples. The present invention is not limited to Examples below.

Example 1

In Example 1, a boron nitride powder was produced according to procedure (a). A resin was filled with the produced boron nitride powder, and evaluations were conducted.
(Synthesis of Boron Carbide)

100 parts of orthoboric acid (hereinafter abbreviated as "boric acid") manufactured by Nippon Denko Co., Ltd. and 35 parts of acetylene black (product name: HS100) manufactured by Denka Company Limited were mixed using a Henschell mixer, then a crucible made of graphite was filled with the mixture, and heated by an arc furnace in an argon atmosphere at 2200° C. for 5 hours to synthesize boron carbide ($B_4C$). The synthesized bulky mass of boron carbide was pulverized by a ball mill for 1 hour and 40 minutes, sieved using a sieve mesh to be classified into a particle size of 75 μm or less, furthermore, washed with aqueous solution of nitric acid to remove impurities such as iron, then filtered and dried to produce boron carbide powder having an average particle size of 10 μm. The carbon content of the obtained boron carbide powder was 19.9%.
(Pressure Nitriding Baking Step)

A crucible made of boron nitride was filled with the synthesized boron carbide, then heated by using a resistance heating furnace in a nitrogen gas atmosphere at 2000° C. under the condition of 9 atm (0.8 MPa) for 10 hours to obtain boron carbonitride ($B_4CN_4$)
(Decarbonizing Crystallization Step)

100 parts of synthesized boron carbonitride and 100 parts of boric acid were mixed using a Henschell mixer, then a crucible made of boron nitride was filled with the mixture, and heated by using a resistance heating furnace up to the retention temperature of 2000° C. under the pressure condition of 0.3 MPa in a nitrogen gas atmosphere at a temperature rising rate of 10° C./min from room temperature to 1000° C. and 2° C./min at 1000° C. or more. By heating at the retention temperature of 2000° C. for the retention time of 5 hours, bulky boron nitride wherein primary particles were aggregated to be a bulky mass was synthesized.
(Pulverizing Step)

The synthesized bulky boron nitride was cracked by a Henschel mixer, then classified with a nylon sieve having 850 μm mesh. After that, pulverizing was conducted by a jet mill ("PJM-80" manufactured by DAIICHI JITSUGYO CO., LTD.) under a pulverizing condition of 0.3 MPa to obtain a boron nitride powder having an average particle size of 8 μm.
(Filling Resin)

The properties of the obtained boron nitride powder as a material for filling a resin were evaluated. 100 vol % of a mixture containing 100 parts of naphthalene-type epoxy resin (manufactured by DIC Corporation, product name: HP4032) and 10 parts of imidazols (manufactured by SHIKOKU CHEMICALS CORPORATION, product name: 2E4MZ-CN) as a curing agent, and 50 vol % of the boron nitride powder were mixed, and the resulting mixture was applied to a PET sheet so as to obtain thickness of 0.3 mm, then subjected to reduced pressure degassing at 500 Pa for 10 minutes. After that, the applied mixture was subjected to press heating and pressurizing under the condition at temperature of 150° C. and pressure of 160 kg/cm² for 60 minutes to produce a sheet having the thickness of 0.05 mm.

The measurement values and evaluations are summarized together with other Examples and Comparative Examples in Table 1 and Table 2 below. In these tables, the case in which fluidity of the slurry after mixing was poor and thus application and shaping was impossible is represented as the sign "-" which means that filling was impossible.

Example 2

In Example 2, the boron nitride powder was synthesized according to procedure (b), then a resin was filled therewith.
(Vapor Phase Reaction Step)

A furnace core tube was installed in a resistance heating furnace and heated to a temperature of 1000° C. Trimethyl borate ("TMB-R" manufactured by TAMA CHEMICALS CO., LTD.) was introduced into the furnace core tube via an introduction pipe by nitrogen bubbling, while ammonia gas (purity 99.9% or more) was also introduced into the furnace core tube via an introduction pipe. The introduced trimethyl borate and ammonia underwent vapor phase reaction in a molar ratio of 1:1.2 in the furnace to conduct synthesis for reaction time of 10 seconds, and thus white powder was produced. The produced white powder was collected.
(Crystallization Step)

A crucible made of boron nitride was filled with the collected white powder and installed in an induction heating furnace, then heated in an atmosphere of mixed nitrogen and ammonia, wherein heating was conducted in an atmosphere containing 10 vol % of ammonia gas up to a temperature of 1000° C., and in an atmosphere containing 50 vol % of ammonia gas at 1000° C. or more to the retention temperature of 1800° C. The powder was heated at the retention temperature for 5 hours, cooled after baking was finished, and the baked product was collected.
(Pulverizing Step)

The synthesized bulky boron nitride was cracked by a Henschel mixer, then classified with a nylon sieve having 850 μm mesh. After that, pulverizing was conducted by a jet mill ("PJM-80" manufactured by DAIICHI JITSUGYO CO., LTD.) under a pulverizing condition of 0.3 MPa to obtain a boron nitride powder having the average particle size of 5 μm.

A resin was filled with the obtained powder under the similar condition to Example 1, and evaluated.

Example 3

In Example 3, the aggregated boron nitride powder was produced under the similar condition to Example 1 except that the pulverizing time in the synthesis of the boron carbide was changed to 1 hour and 20 minutes and that "boron carbide having an average particle size of 14 m" was synthesized.

Example 4

In Example 4, the boron nitride powder was produced under the similar condition to Example 1 except that the pulverizing pressure of a jet mill was 0.5 MPa.

Example 5

In Example 5, the boron nitride powder was produced under the similar condition to Example 1 except that the pulverizing time in the synthesis of the boron carbide was changed to 1 hour and 20 minutes and that "boron carbide (carbon content: 19.8%) having the average particle size of 14 m" was synthesized and that aggregated boron nitride was pulverized at a pulverizing pressure of a jet mill of 0.5 MPa.

Example 6

In Example 6, the boron nitride powder was produced under the similar condition to Example 1 except that the temperature rising rate at 1000° C. or more was 0.5° C./min.

Example 7

In Example 7, the boron nitride powder was produced under the similar condition to Example 1 except that the temperature rising rate at 1000° C. or more was 5° C./min.

Comparative Example 1

In Comparative Example 1, the boron nitride powder was produced under the similar condition to Example 1 except that the pulverizing time in the synthesis of the boron carbide was changed to 5 hours and that "boron carbide having an average particle size of 2 m" was synthesized and the aggregated boron nitride was synthesized. Since the average particle size of the obtained boron nitride powder was too small, the particle strength was not measurable.

Comparative Example 2

In Comparative Example 2, the boron nitride powder was produced under the similar condition to Example 1 except that the pulverizing time in the synthesis of the boron carbide was changed to 45 minutes and that "boron carbide (carbon content 20.1%) having the average particle size of 25 m" was synthesized.

Comparative Example 3

In Comparative Example 3, the boron nitride powder was produced under the similar condition to Example 1 except that the pulverizing time in the synthesis of the boron carbide was changed to 45 minutes and that "boron carbide (carbon content 20.0%) having the average particle size of 25 m" was synthesized and that the pulverizing pressure of a jet mill was 0.5 MPa and pulverizing was conducted until coarse powder particles were removed.

Comparative Example 4

In Comparative Example 4, the boron nitride powder was produced under the similar condition to Example 1 except that the temperature rising rate at 1000° C. or more was 10° C./min.

Comparative Example 5

In Comparative Example 5, the boron nitride powder was produced under the similar condition to Example 2 except that the baking was conducted in an atmosphere containing 50 vol % of ammonia gas up to a temperature of 1000° C., and as a result, the aggregated boron nitride in which primary particles were scaly was not obtained but the boron nitride microparticles in which primary particles were spherical were obtained. Since the average particle size of the obtained boron nitride powder was too small, the particle strength was not measurable.

TABLE 1

|  |  | Example 1 | Example 2 | Example 3 | Example 4 | Example 5 | Example 6 | Example 7 |
|---|---|---|---|---|---|---|---|---|
| Boron nitride powder | Average particle size μm | 8 | 5 | 17 | 3 | 8 | 8 | 8 |
|  | Orientation index | 13 | 7 | 12 | 13 | 18 | 13 | 13 |
|  | Particle strength MPa (at 63.2%) | 8 | 10 | 7 | 10 | 6 | 12 | 5 |
| 50 μm film formation |  | ○ | ○ | ○ | ○ | ○ | ○ | ○ |
| Heat conductivity | W/(m · K) | 7 | 6 | 8 | 5 | 7 | 7 | 7 |

TABLE 2

|  |  | Comparative Example 1 | Comparative Example 2 | Comparative Example 3 | Comparative Example 4 | Comparative Example 5 |
|---|---|---|---|---|---|---|
| Boron nitride powder | Average particle size μm | 1 | 24 | 8 | 8 | 0.5 |
|  | Orientation index | 24 | 13 | 26 | 13 | 7 |
|  | Particle strength MPa (at 63.2%) | — | 6 | 6 | 4 | — |
| 50 μm film formation |  | ○ | x | ○ | ○ | ○ |
| Heat conductivity | W/(m · K) | 2 | — | 4 | 4 | 2 |

INDUSTRIAL APPLICABILITY

The present invention may provide, particularly preferably, a boron nitride powder having excellent heat conductivity with which a resin composition for an insulating layer and thermal interface material having a film thickness of in particular 100 μm or less for a printed wiring board is filled, a method for production thereof and a heat conductive resin composition produced using thereof. The powder may be suitably used as a raw material of a heat-dissipating member of a heat generating electronic part such as a power device, and the heat conductive resin composition may be widely used for a heat-dissipating member and the like.

The invention claimed is:

1. A boron nitride powder which comprises bulky boron nitride formed such that scaly primary particles of hexagonal boron nitride are aggregated to form bulky particles, and which has the following characteristics (A) to (C):
   (A) a particle strength of the bulky particles at a cumulative breakdown rate of 63.2% is 5.0 MPa or more;
   (B) an average particle size of the boron nitride powder is 2 μm or more and 20 μm or less; and
   (C) an orientation index of the boron nitride powder as determined from X-ray diffraction is 20 or less.

2. A heat-dissipating member comprising the boron nitride powder according to claim 1 and having a film thickness of 100 μm or less.

3. A method for producing the boron nitride powder according to claim 1, the method comprising:
   a pressure nitriding baking step of baking boron carbide having a carbon content of 18% or more and 21% or less and an average particle size of 5 μm or more and 15 μm or less in a pressurized nitrogen atmosphere at 1800° C. or more and 0.6 MPa or more;
   a decarbonizing crystallization step of mixing a baked product obtained by the pressure nitriding baking step is mixed with a boron source, and heating the resulting mixture to a temperature capable of initiating decarbonization, then heating the mixture to a retention temperature of 1800° C. or more at a temperature rising rate of 5° C./min or less, and retaining the mixture in nitrogen atmosphere at the retention temperature to obtain bulky boron nitride;
   a pulverizing step of pulverizing the bulky boron nitride obtained by the decarbonizing crystallization step to obtain the boron nitride powder having an average particle size of 2 μm or more and 20 μm or less.

4. A method for producing the boron nitride powder according to claim 1, the method comprising:
   a vapor phase reaction step of subjecting alkoxide borate gas and ammonia gas to vapor phase reaction at 750° C. or more;
   a crystallization step of heating an intermediate obtained by the vapor phase reaction step until a baking temperature of 1500° C. or more is reached under conditions of an atmosphere containing 20 vol % or less of ammonia up to 1000° C. and an atmosphere containing 50 vol % or more of ammonia at 1000° C. or more, and baking the intermediate at the baking temperature to obtain bulky boron nitride;
   a pulverizing step of pulverizing the bulky boron nitride obtained by the crystallization step to obtain the boron nitride powder having an average particle size of 2 μm or more and 20 μm or less.

* * * * *